(12) United States Patent
Wada et al.

(10) Patent No.: US 11,537,049 B2
(45) Date of Patent: Dec. 27, 2022

(54) METHOD OF LINE ROUGHNESS IMPROVEMENT BY PLASMA SELECTIVE DEPOSITION

(71) Applicant: Tokyo Electron Limited, Tokyo (JP)

(72) Inventors: Toshiharu Wada, Albany, NY (US); Chia-Yun Hsieh, Albany, NY (US); Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 159 days.

(21) Appl. No.: 16/680,989

(22) Filed: Nov. 12, 2019

(65) Prior Publication Data

US 2020/0272054 A1 Aug. 27, 2020

Related U.S. Application Data

(60) Provisional application No. 62/810,592, filed on Feb. 26, 2019.

(51) Int. Cl.
*G03F 7/16* (2006.01)
*G03F 7/20* (2006.01)
(Continued)

(52) U.S. Cl.
CPC .............. *G03F 7/2002* (2013.01); *G03F 1/22* (2013.01); *G03F 7/0035* (2013.01); *G03F 7/164* (2013.01)

(58) Field of Classification Search
CPC ...... G03F 7/2002; G03F 7/0035; G03F 7/164; G03F 1/22; G03F 7/20; G03F 7/035
See application file for complete search history.

(56) References Cited

U.S. PATENT DOCUMENTS 5,082,524 A * 1/1992 Cathey ...................... C23F 4/00
216/37
5,739,047 A * 4/1998 Chiang ............. H01L 21/76843
438/653

(Continued)

FOREIGN PATENT DOCUMENTS

JP 01-052142 * 2/1989 ............... G03F 7/00
JP 02-271359 * 11/1990 ............... G03F 7/38

OTHER PUBLICATIONS

"Silylation method to enhance the contrast of reactive ion etched images", IBM Tech. Disci. Bull., vol. 32(2) pp. 14-16 (Jul. 1989).*

*Primary Examiner* — Martin J Angebranndt
(74) *Attorney, Agent, or Firm* — Weihrouch IP

(57) ABSTRACT

A substrate is provided with a patterned layer, for example, a photo resist layer, which may exhibit line roughness. In one exemplary embodiment, the patterned layer may be an extreme ultraviolet (EUV) photo resist layer. In one method, selective deposition of additional material is provided on the EUV photo resist layer after patterning to provide improved roughness and lithographic structure height to allow for more process margin when transferring the pattern to a layer underlying the photo resist. The additional material is deposited selectively thicker in areas above the photo resist than in areas where the photo resist is not present, such as exposed areas between the photo resist pattern. Pattern transfer to a layer underlying the photo resist may then occur (for example via an etch) while the patterned photo resist and additional material above the photo resist may collectively operate as an etch mask.

22 Claims, 9 Drawing Sheets

(51) Int. Cl.
    *G03F 7/004*     (2006.01)
    *G03F 1/22*     (2012.01)
    *G03F 7/00*     (2006.01)

(56) References Cited

U.S. PATENT DOCUMENTS

| | | | |
|---|---|---|---|
| 11,094,543 B1* | 8/2021 | Han | H01L 21/0273 |
| 2004/0033445 A1* | 2/2004 | Lee | G03F 7/405 |
| | | | 430/313 |
| 2004/0169009 A1* | 9/2004 | Kitamura | G03F 7/265 |
| | | | 216/67 |
| 2007/0026677 A1* | 2/2007 | Ji | H01L 21/0337 |
| | | | 438/689 |
| 2008/0182419 A1* | 7/2008 | Yasui | H01L 21/32139 |
| | | | 438/710 |
| 2013/0023124 A1* | 1/2013 | Nemani | H01L 21/31138 |
| | | | 257/E21.271 |
| 2013/0267094 A1* | 10/2013 | Katsunuma | H01J 37/32669 |
| | | | 438/694 |
| 2015/0243524 A1* | 8/2015 | Kihara | H01J 37/32733 |
| | | | 438/694 |
| 2015/0332929 A1* | 11/2015 | Hisamatsu | H01L 21/02167 |
| | | | 438/694 |
| 2016/0163557 A1* | 6/2016 | Hudson | H01L 21/31116 |
| | | | 156/345.24 |
| 2016/0209749 A1* | 7/2016 | Yamamoto | G03F 7/16 |

\* cited by examiner

METHOD OF LINE ROUGHNESS IMPROVEMENT BY PLASMA SELECTIVE DEPOSITION

This application claims priority to U.S. Provisional Patent Application No. 62/810,592 entitled "Method Of Line Roughness Improvement By Plasma Selective Deposition", filed Feb. 26, 2019; the disclosure of which is expressly incorporated herein, in its entirety, by reference.

BACKGROUND

The present disclosure relates to the processing of substrates, such as for example, semiconductor substrates. In particular, it provides a novel method to pattern substrates having very narrow pitch designs.

As geometries in substrate processing continue to shrink, the technical challenges to forming structures on substrates via photolithography techniques increase. As requirements for lower pitch structures arose, a variety of photolithography techniques have been utilized for achieving suitable photolithography for such narrow pitches including extreme ultraviolet (EUV) lithography (lithography utilizing wavelengths of light in the EUV range, most typically 13.5 nm wavelengths), multiple patterning schemes (such as self-aligned double patterning (SADP), self-aligned triple patterning (SATP), etc.), argon fluoride (ArF) lithography, or other narrow pitch patterning methods.

It has been found that as pitches and dimensions decrease, the line width roughness (LWR) and line edge roughness (LER) performance degrades during the pattern transfer process. Thus, as the feature size is reduced, the LWR and LER have become recognized as a critical concern. The effects of LWR and LER have become particularly problematic for EUV lithography where the photo resist height may be short and the patterned photo resist exhibits a high degree of roughness.

Conventional EUV lithography techniques attempt to address the incoming photo resist roughness by use of a plasma treatment before transferring the photo resist pattern to an underlying layer. FIGS. 1A-1C illustrates an exemplary conventional technique. As shown in FIG. 1A, a substrate 100 is provided with an incoming patterned photo resist layer 105 is provided on underlying layers 110. The particular underlying layers 110 are merely exemplary. As shown in Figure A1, underlying the patterned photo resist layer 105 are a reflective multilayer 115, an optical planarization layer 120 and a hard mask layer 125, respectively. Such layers are well known in the art and are merely exemplary and it will be recognized that such layers may be formed over other structures of the substrate 100, all as is known in the art. The particular underlying layers utilized will vary by the particular substrate process flow utilized and may vary within a given process flow at different process steps. As shown in FIG. 1A, the incoming patterned photo resist layer 105 may exhibit roughness. Then a plasma treatment may be provided to decrease the roughness such as shown in FIG. 1B in which the patterned photo resist layer 105 has less roughness. However, though such plasma treatment may decrease roughness, the height of the photo resist will generally be decreased. Then, as shown in FIG. 1C, during the pattern transfer to the reflective multilayer layer 105, the transfer process may break through the photo resist due to the decreased photo resist height and the selectivity of the process. As illustrated in FIG. 1C, the patterned photo resist layer 105 may even be completely removed, impacting the patterned formation in the layer underlying the photo resist such as the patterned reflective multilayer structure 115A. In this manner, as shown in FIGS. 1A-1C, roughness may be improved, but lithographic height of the photo resist may decrease. The decrease in height may cause resist and pattern breaks caused by mask breakdown and/or critical dimension (CD) loading from mask selectivity.

This conventional process may lead to pattern breaks and critical dimension (CD) loading due to the low photo resist to reflective multilayer layer selectivity. A trade off, therefore, exists between roughness improvement and the desired photo resist height. To improve the reliability and performance of EUV lithography, it would be desirable to provide an improved process for reducing LWR and LER issues.

SUMMARY

Described herein is an innovative method to perform photo lithography pattern transfer. A substrate is provided with a patterned layer, such as for example, a photo resist layer, which may exhibit LWR and LER. In one exemplary embodiment, the patterned layer may be an EUV photo resist layer. In the method disclosed, deposition of an additional material is provided on the EUV photo resist layer after patterning to provide improved roughness and lithographic structure height to allow for more process margin when transferring the pattern to a layer underlying the photo resist. The additional material is deposited selectively thicker in areas above the photo resist than in areas where the photo resist is not present, such as exposed areas between the photo resist pattern. Pattern transfer to a layer underlying the photo resist may then occur (for example via an etch) while the patterned photo resist and additional material above the photo resist may collectively operate as an etch mask.

In one embodiment, the process described includes a process in which the patterned EUV photo resist is cured, followed by deposition of the additional material that is selectively thicker in areas above the photo resist. In one embodiment, the cure process includes the deposition of a first additional material selectively on the patterned photo resist. Then, a second selective deposition is performed which provides a second additional material selectively thicker above regions having the patterned photo resist as opposed to unpatterned regions. Pattern transfer to a layer underlying the photo resist may then occur (for example via an etch) while the patterned photo resist, the first additional material above the photo resist and the second additional material above the photo resist collectively operate as an etch mask.

In one embodiment, a method for processing a substrate is provided. The method may comprise providing the substrate with at least one underlying layer and providing the substrate with a patterned photo resist layer overlying the at least one underlying layer, the patterned photo resist layer providing patterned areas of the substrate and unpatterned areas of the substrate. The method further comprises depositing an additional material on the substrate, the additional material selectively deposited thicker on the photo resist than on the unpatterned areas of the substrate. The method further comprises utilizing the patterned photo resist layer and the additional material as an etch mask when transferring a pattern of the photo resist layer to the at least one underlying layer, wherein the use of the additional material provides improved line width roughness or line edge roughness characteristics.

In another embodiment, a method for processing a substrate is provided. The method may comprises providing the substrate with at least one underlying layer and providing the substrate with a patterned extreme ultraviolet (EUV) photo resist layer overlying the at least one underlying layer. The method further comprises performing a cure process to harden the patterned EUV photo resist. The method also comprises depositing an additional material on the substrate, the additional material selectively deposited thicker on the patterned EUV photo resist than on other areas of the substrate. The method further comprises utilizing the patterned extreme ultraviolet (EUV) photo resist layer and the additional material as an etch mask when transferring a pattern of the photo resist layer to the at least one underlying layer, wherein the use of the additional material provides improved line width roughness or line edge roughness characteristics.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Described herein is an innovative method to perform photo lithography pattern transfer. A substrate is provided with a patterned layer, such as for example, a photo resist layer, which may exhibit LWR and LER. In one exemplary embodiment, the patterned layer may be an EUV photo resist layer. In the method disclosed, deposition of an additional material is provided on the EUV photo resist layer after patterning to provide improved roughness and lithographic structure height to allow for more process margin when transferring the pattern to a layer underlying the photo resist. The additional material is deposited selectively thicker in areas above the photo resist than in areas where the photo resist is not present, such as exposed areas between the photo resist pattern. Pattern transfer to a layer underlying the photo resist may then occur (for example via an etch) while the patterned photo resist and additional material above the photo resist may collectively operate as an etch mask.

In one embodiment, the process described includes a process in which the patterned EUV photo resist is cured, followed by deposition of the additional material that is selectively thicker in areas above the photo resist. In one embodiment, the cure process includes the deposition of a first additional material selectively on the patterned photo resist. Then, a second selective deposition is performed which provides a second additional material selectively thicker above regions having the patterned photo resist as opposed to unpatterned regions. Pattern transfer to a layer underlying the photo resist may then occur (for example via an etch) while the patterned photo resist, the first additional material above the photo resist and the second additional material above the photo resist collectively operate as an etch mask.

Figure 1A:
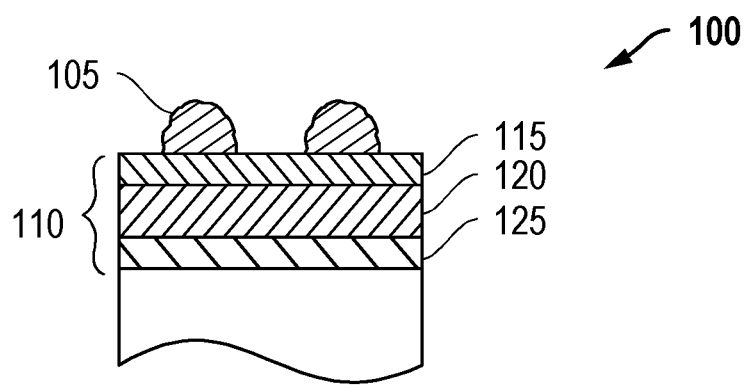
FIGS. 1A-1C illustrate a prior art approach to address line roughness.
Figure 1B:
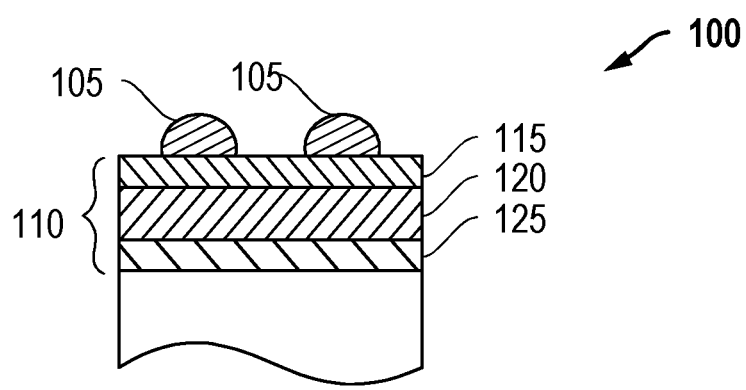
Figure 1C:
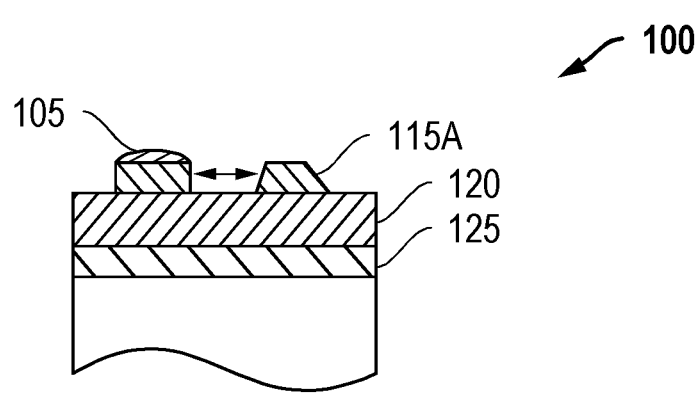
Figure 2A:
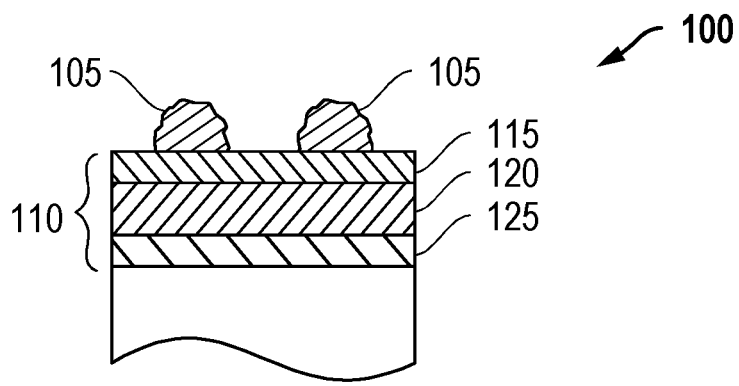
FIGS. 2A-2C illustrate one exemplary embodiment of a method of line roughness improvement by the use of plasma selective deposition.
Figure 2B:
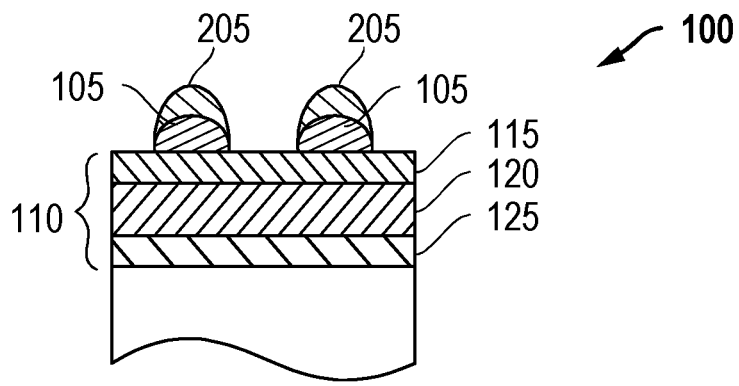
Figure 2C:
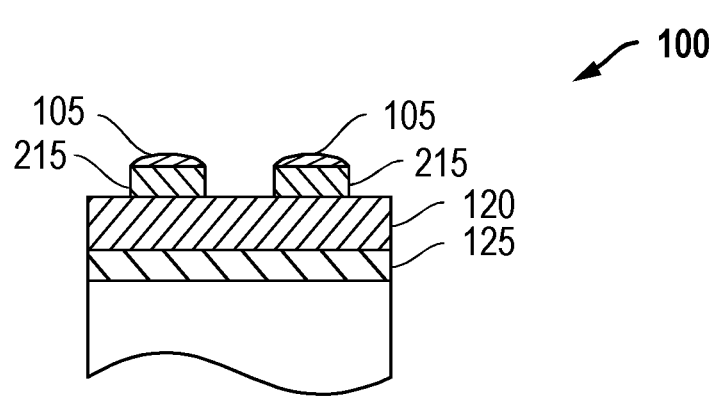

An exemplary embodiment of a method utilizing the techniques described herein may be seen with respect to the figures and description provided herein. In one embodiment LWR and LER effects are lessened by use of a selective deposition upon the patterned EUV photo resist lines. The selective deposition may improve the roughness characteristics of the patterned EUV photo resist lines and increase the height of the lithography structure so as to provide more process margin during subsequent etching and pattern transfer. FIGS. 2A-2C an exemplary embodiment of a technique to improve line roughness. As illustrated in FIG. 2A, an incoming patterned lithography structure similar to that of FIG. 1A is provided. As shown in FIG. 2A, an incoming EUV patterned photo resist layer 105 is provided on underlying layers 110. The particular underlying films are merely exemplary. As shown in FIG. 2A, the underlying layers 110 include are a reflective multilayer 115, an optical planarization layer 120 and a hard mask layer 125, respectively. As mentioned above, the underlying layers 110 may be formed on other layers and structures of the substrate 100.

The structure of the FIG. 2A may be provided on a substrate 100 utilizing any of a wide variety of substrate processing techniques to achieve the structure shown, including additional layers (not shown) underlying those layers shown. The substrates utilized with the techniques disclosed herein may be any substrates for which the patterning and etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

As shown in FIG. 2B, a selective deposition material 205 is provided on the upper portions of the patterned photo resist layer 105. Roughness may be improved and the line height may be increased by such a process as shown in FIG. 2B. Then, when pattern transfer occurs, as shown in FIG. 2C, there is less likelihood of photo resist break through and the associated pattern breaks and CD loading. Thus, as shown in FIG. 2C, portions of the patterned photo resist layer 105 survive the pattern transfer process such that the resulting pattern structures 215 formed in the reflective multilayer 115 conform to the desired pattern without pattern breaks or CD effects.

The step of FIG. 2B may be accomplished in a variety of different manners. In one embodiment, a plasma deposition is used to provide the additional material on the photo resist. In one embodiment, the second step may be configured as only a single deposition step. Alternatively, the second step may include a cure process prior to the deposition of the additional material. In yet another embodiment, the second step may include a cure process and a first deposition process, followed by a second deposition process.

Figure 3A:
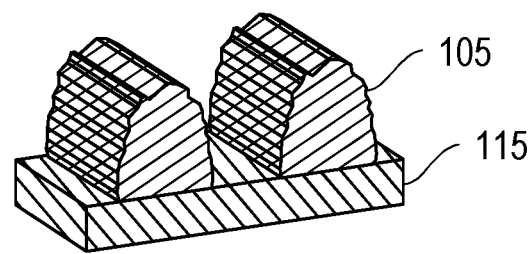
FIGS. 3A-3B illustrate another exemplary embodiment of a method of line roughness improvement by the use of plasma selective deposition
Figure 3B:
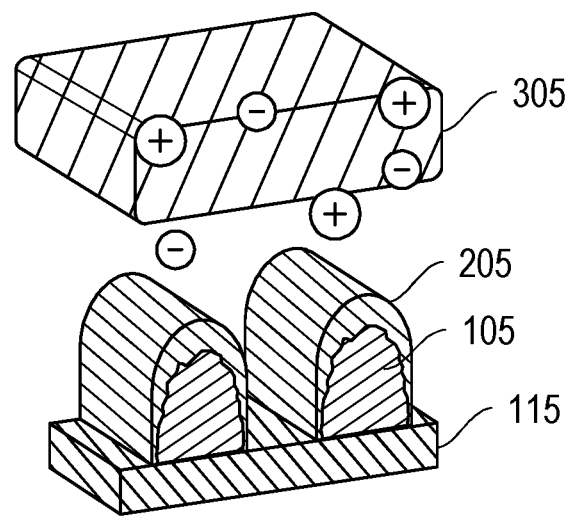

FIGS. 3A-3B illustrate an example of usage of a single plasma deposition. As shown in FIG. 3A an incoming structure is provided illustrating some of the layers of a structure such as shown in FIG. 2A. In will be recognized that other layers will be present but that the Figure of 3A illustrates just the patterned photo resist layer 105 and the reflective multilayer 115 for ease of understanding. As shown in FIG. 3B, a gas plasma deposition process 305 is utilized to selectively deposit additional material on the patterned photo resist lines.

Figure 4A:
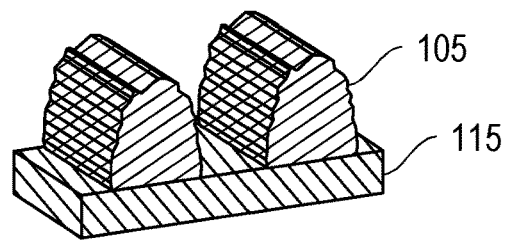
FIGS. 4A-4C illustrate another exemplary embodiment of a method of line roughness improvement by the use of a cure process and a plasma selective deposition.
Figure 4B:
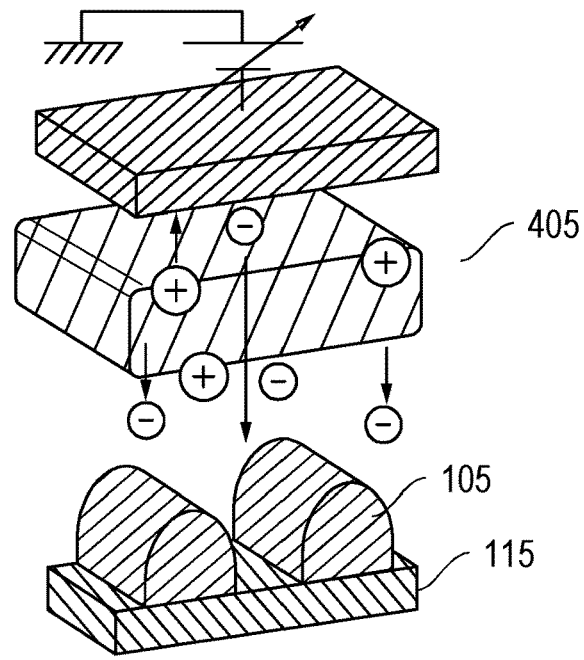
Figure 4C:
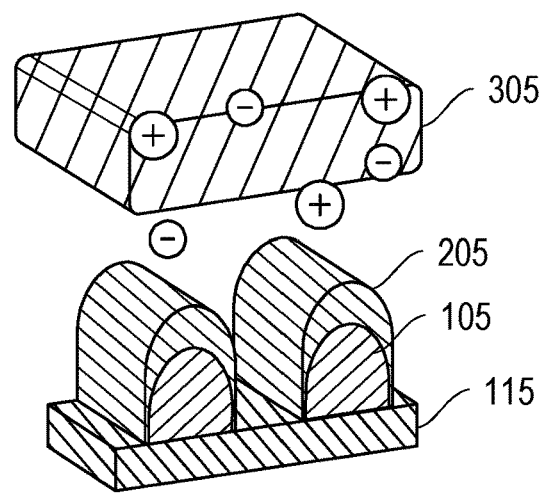

Alternatively, a curing process may be performed before deposition of additional material. FIGS. 4A-4C illustrate the addition of a curing process. As shown in FIG. 4A, an incoming structure similar to that of FIGS. 2A and 3A is provided. FIG. 4A illustrates the usage of a curing process which hardens the patterned EUV photo resist prior to depositing the additional material on the patterned photo resist layer 105. In the example of FIG. 4A, the cure/hardening process may include a gas plasma cure process 405 may cure the patterned photo resist layer 105 and may also deposit a thin first additional material (the first additional material not shown). Then, as shown in FIG. 4C a deposition of thicker additional material such as selective deposition material 205 may be formed by a gas plasma deposition process 305.

The process of FIGS. 4A-4C may advantageously allow for more process margin as compared to the process of FIGS. 3A-3B. For example, in order to achieve the needed lithographic stack height to provide the desired etch margins in the FIGS. 3A-3B process, the thickness of the additional material may be such that pattern collapse may occur. Further with larger deposition amounts of the FIGS. 3A-3B process, the amount of additional material deposited at the bottom of the structure (for example on the reflective multilayer) may be undesirably large.

Figure 5A:
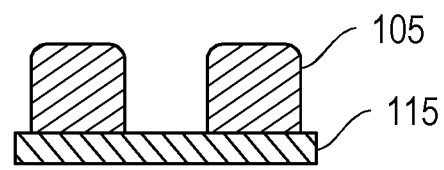
FIGS. 5A-5B illustrate another exemplary embodiment of a method of line roughness improvement by the use of plasma selective deposition
Figure 5B:
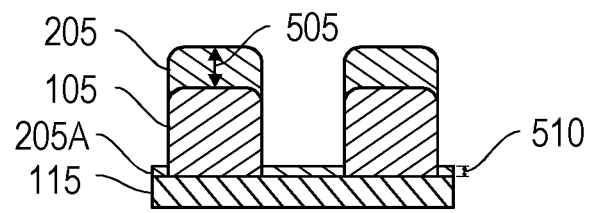

FIGS. 5A-5B and 6A-6C provide more detail of the processes shown in FIGS. 3A-3B and 4A-4B respectively. As shown in FIG. 5A, an incoming structure similar to FIGS. 2A, 3A, and 4A is provided. Then, as shown in FIG. 5B, the additional material of the selective deposition material 205 may be deposited selectively and relatively thickly on the tops of the patterned photo resist layer 105 and thinner in the exposed regions of the layer underlying the photo resist (for example a reflective multilayer 115). Thus, as shown in FIG. 5B, a first thickness 505 of material may be provided on the photo resist and thinner second thickness 510 of material may be provided on layers underlying the photo resist. The thickness difference in the different regions may result at least in part from an aspect ratio effect of the deposition process. Thus benefits of a surface modification by a loading deposition effect are achieved to provide roughness and pattern height advantages.

Figure 6A:
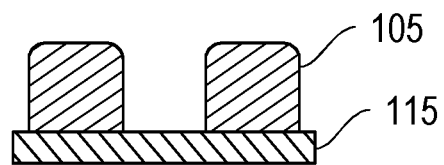
FIGS. 6A-6C illustrate another exemplary embodiment of a method of line roughness improvement by the use of a cure process and a plasma selective deposition
Figure 6B:
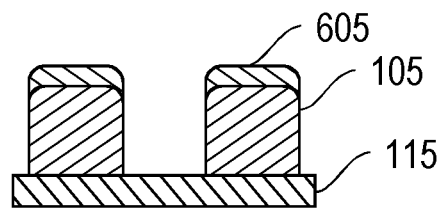
Figure 6C:
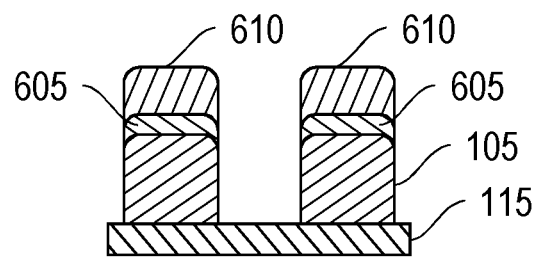

FIGS. 6A-6C illustrates a multi-step process which includes a cure step. As shown in FIG. 6A, the incoming structure may be similar to the incoming structures described above. As shown in FIG. 6B, the process includes a cure process. In the example of FIG. 6B, the process also includes the deposition of a first additional material 605. Specifically, the step of FIG. 6B provides a cure and also a plasma vapor deposition process of a first additional material 605 on the patterned photo resist layer 105 as shown. The first additional material 605 selectively deposits thicker on the top portions of the photo resist than on the exposed underlying layer (for example the reflective multilayer 115) as shown. Then, as shown in FIG. 6C a step is provided which provides a deposition similar to that of the step of FIG. 5B. Thus, the first additional material and the second additional material, both being deposited by a plasma deposition process, may be formed as shown. In this manner, a first layer of additional material and a second layer of additional material may be provided via first and second deposition processes. The first plasma process and the second plasma process may both different processes as described in more detail below. As shown in FIG. 6C, deposition of a second additional material 610 is preferential provided above the photo resist structure as a result of aspect ratio effects and surface energy effects caused by the deposition of the first additional material 605 as explained in more detail below. It will be noted that the second additional material 610 may be the selective deposition material 205 described above with regard to the other figures.

The techniques described herein may utilize a wide range of processes for accomplishing the selective deposition(s) and curing steps described above. In one embodiment, plasma deposition processes are utilized. In one embodiment, the deposition of the step of FIGS. 3B and 5B and the step of FIGS. 4C and 6C may be a plasma process utilizing silicon tetrachloride ($SiCl_4$) gas. The $SiCl_4$ plasma may cause silicon (Si) or silicon chloride (SiCl) to be deposited on the photo resist surfaces. In one embodiment, the cure and deposition process of FIGS. 4B and 6B may be accomplished by the use of a dichlorosilane (DCS) plasma process. The curing effect of the photo resist may be accomplished by the electron energy from the DC voltage of the plasma system (for example the upper electrode as shown in FIG. 4B) while a silicon coating occurs from the plasma vapor deposition effects of the DCS plasma by gas sputtering via the upper electrode of the plasma system. Note the plasma systems described herein may utilize additional gases such as argon, helium, nitrogen, and hydrogen as is known in the art.

Figure 7:
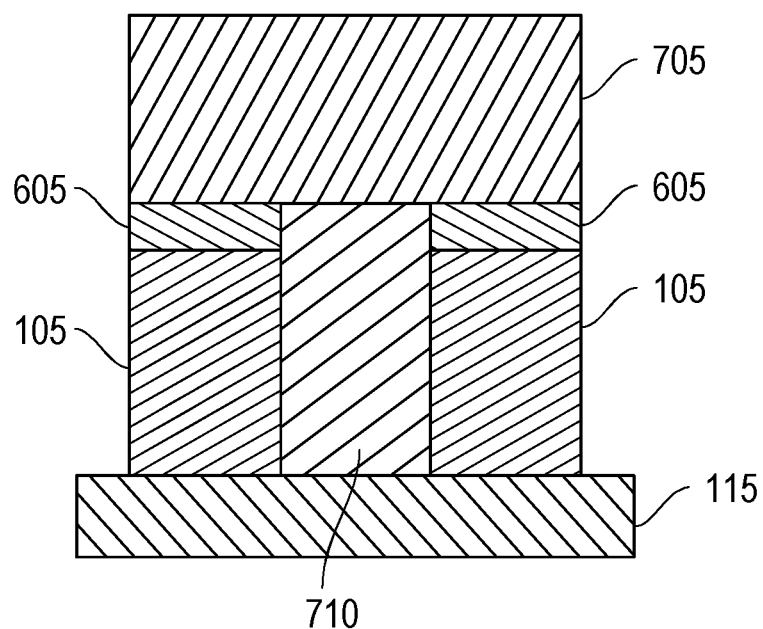
FIG. 7 illustrates regions which have varying deposition properties due to aspect ratio effects.

As mentioned above, the selective deposition processes of additional material on in the upper areas of the photo resist may be area selective due to aspect ratio effects (thicker deposition on the tops of structures) and also surface energy effects resulting from the plasma vapor deposition (PVD) material formed in the curing step. In one example, PVD silicon may be formed as part of the curing step. More specifically, area specific depositions may result from varying ion flux and radical in the plasma steps (both the DCS gas plasma and the $SiCl_4$ gas plasma). FIG. 7 illustrates the varying regions. As shown in FIG. 7, the pattern photo resist layer 105 and reflective multilayer 115 are provided similar to as described above. Further, the first additional material 605 such as shown in FIG. 6B is also shown. As mentioned, in one embodiment, the first additional material may be a silicon coating. In general, the ion flux and the radical flux amount of the plasma in the first area 705 of FIG. 7 are higher than in the second area 710. Thus, selective deposition occurs in the first area 705 region (at the top lithographic stack structure such as the top of the patterned photo resist layer 105). Thus, enhanced deposition occurs in the first area 705 region as opposed to the deposition at the bottom of the second area 710. FIG. 7 illustrates the structure present at the SiCl₄ gas plasma step when a previous DCS plasma cure process was utilized. However, the concept of first area 705 having greater flux amounts also occurs in the DCS plasma process.

In addition to the aspect ratio effects providing selective deposition, selective deposition also occurs in the embodiments of FIGS. 4C, 6C and 7 due to the existence of PVD silicon layer formed at the top of the photo resist during the cure process as a result of the DCS plasma which deposits silicon. As noted, the silicon is preferentially deposited at the top of the patterned photo resist. The different amount of silicon at the top of the photo resist results in a preferential deposition of additional material (such as in the steps of FIGS. 4C, 6C and 7) on the silicon layer caused by surface energy effects. Specifically the material surface energy provided by the silicon layer atop the photo resist provides a surface energy at the top of the photo resist that is similar to the gas plasma deposition process 305 deposition film (silicon or SiCl deposition from the SiCl₄ plasma). This similarity causes selective deposition on the silicon (or SiCl) layer that is atop the photo resist as opposed to the underlying layer (for example the reflective multilayer 115). In this manner, deposition is further enhanced in areas above the patterned photo resist as opposed to the unpatterned regions. Therefore, both aspect ratio effects and surface energy effects may contribute to the selective deposition above the photo resist.

Figure 8:
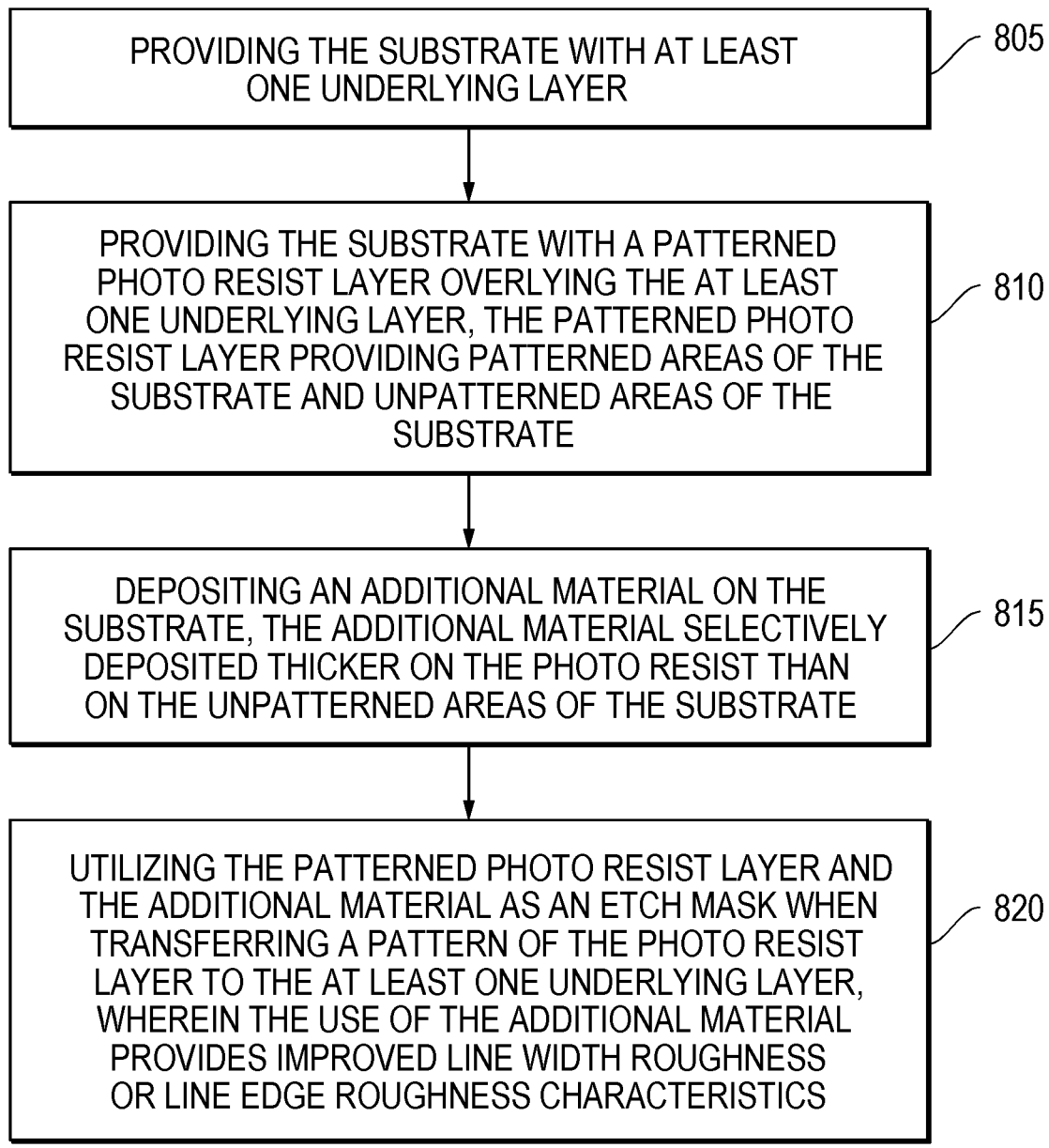
FIGS. 8-9 illustrate exemplary methods of use of the techniques described herein for line roughness improvement.
Figure 9:
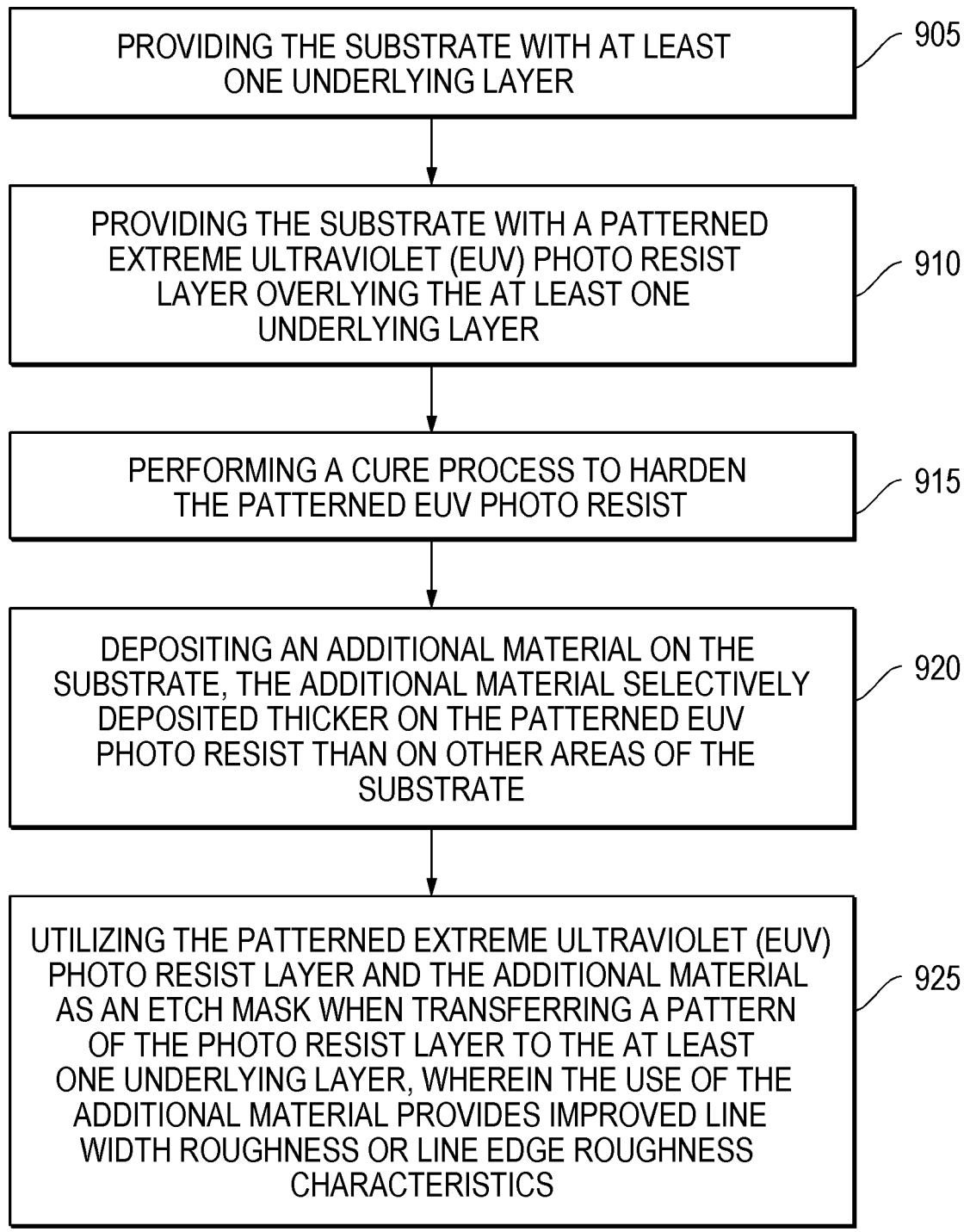

FIGS. 8-9 illustrate exemplary methods for use of the processing techniques described herein. It will be recognized that the embodiments of FIGS. 8-9 are merely exemplary and additional methods may utilize the techniques described herein. Further, additional processing steps may be added to the methods shown in FIGS. 8-9 as the steps described are not intended to be exclusive. Moreover, the order of the steps is not limited to the order shown in the FIGS. 8-9 as different orders may occur and/or various steps may be performed in combination or at the same time.

FIG. 8 illustrates a method for processing a substrate. As shown in FIG. 8, the method includes a step 805 of providing the substrate with at least one underlying layer. The method also includes step 810 of providing the substrate with a patterned photo resist layer overlying the at least one underlying layer, the patterned photo resist layer providing patterned areas of the substrate and unpatterned areas of the substrate. The method further includes step 815 of depositing an additional material on the substrate, the additional material selectively deposited thicker on the photo resist than on the unpatterned areas of the substrate. The method also comprises step 820 of utilizing the patterned photo resist layer and the additional material as an etch mask when transferring a pattern of the photo resist layer to the at least one underlying layer, wherein the use of the additional material provides improved line width roughness or line edge roughness characteristics.

FIG. 9 illustrates a method for processing a substrate. As shown in FIG. 9, the method includes step 905 of providing the substrate with at least one underlying layer. The method also includes step 910 of providing the substrate with a patterned extreme ultraviolet (EUV) photo resist layer overlying the at least one underlying layer. The method further comprises step 915 of performing a cure process to harden the patterned EUV photo resist. The method also includes step 920 of depositing an additional material on the substrate, the additional material selectively deposited thicker on the patterned EUV photo resist than on other areas of the substrate. The method further comprises step 925 of utilizing the patterned extreme ultraviolet (EUV) photo resist layer and the additional material as an etch mask when transferring a pattern of the photo resist layer to the at least one underlying layer, wherein the use of the additional material provides improved line width roughness or line edge roughness characteristics.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for processing a substrate, comprising:
   providing the substrate with at least one underlying layer;
   providing the substrate with a patterned photoresist layer overlying the at least one underlying layer, the patterned photoresist layer providing photoresist layer coated areas of the at least one underlying layer and unpatterned areas of the substrate, the unpatterned areas of the substrate located between side surfaces of the photoresist layer coated areas;
   performing, with a first plasma deposition process, a photoresist modification process;
   depositing, with a second plasma deposition process after the photoresist modification process is performed, an additional material on the substrate in which an ion flux of the second plasma deposition process is higher in an area above a top surface of the photoresist layer than the unpatterned areas of the substrate such that the additional material is selectively deposited thicker on the top surface of the photoresist layer than on the unpatterned areas of the substrate, the additional material on the top surface of the photoresist layer having a first thickness, the additional material on the unpatterned areas having a second thickness that is less than the first thickness, the second thickness being greater than zero; and
   utilizing the patterned photoresist layer and the additional material as an etch mask, and transferring a pattern of the photoresist layer to the at least one underlying layer with the etch mask,
   wherein the use of the additional material provides improved line width roughness or line edge roughness characteristics of the patterned photoresist layer, and
   wherein the first plasma deposition process and the second plasma deposition process have different gas chemistries, the first plasma deposition process and the second plasma deposition process are performed prior to using the photoresist layer and the additional material as an etch mask and transferring the pattern, and an etch step is not performed between the first plasma deposition process and the second plasma deposition process.

2. The method of claim 1, wherein the patterned photoresist layer is an extreme ultraviolet (EUV) photoresist layer.

3. The method of claim 1, wherein the second plasma deposition process utilizes silicon tetrachloride gas.

4. The method of claim 1, wherein the first plasma deposition process deposits a first layer of additional material, and the second plasma deposition process deposits a second layer of additional material which is different from the first layer of additional material.

5. The method of claim 4, wherein the first layer of additional material is different from the second layer of additional material, each of the first and second layers of additional material comprising silicon, and prior to utilizing the etch mask and transferring the pattern the second layer of additional material has a thickness larger than a thickness of the first layer of additional material.

6. The method of claim 4, wherein:
the first and second layers of additional material are each silicon containing materials which are different from each other;
the second layer of additional material deposited in the second plasma deposition process is thicker than the first layer of additional material deposited in the first deposition process, and the first plasma deposition process is a PVD process.

7. The method of claim 4, wherein the first plasma deposition process utilizes dichlorosilane gas and the second plasma deposition process utilizes silicon tetrachloride gas, and the first plasma deposition process deposits the first layer of additional material with a thickness different from a thickness of the second layer of additional material deposited with the second plasma deposition process.

8. The method of claim 7, wherein the second layer of additional material deposited in the second plasma deposition process is thicker than the first layer of additional material deposited in the first deposition process, and the first plasma deposition process is a PVD process.

9. A method for processing a substrate, comprising:
providing the substrate with at least one underlying layer;
providing the substrate with a patterned extreme ultraviolet (EUV) photoresist layer overlying the at least one underlying layer;
performing a cure process to harden the patterned EUV photoresist layer, the cure process including depositing a first layer of additional material on the patterned EUV photoresist layer;
depositing a second layer of additional material on the substrate, the second layer of additional material selectively deposited, based on the first layer of additional material deposited during the cure process, on the first layer of additional material and above a top surface of the patterned EUV photoresist layer such that a first thickness of the second layer of additional material above the top surface of the patterned EUV photoresist layer is larger than a second thickness of the second layer of additional material on areas of the at least one underlying layer not coated with the patterned EUV photoresist layer, the second thickness being greater than zero; and
utilizing the patterned EUV photoresist layer, the first layer of additional material, and the second layer of additional material as an etch mask and transferring a pattern of the photoresist layer to the at least one underlying layer with the etch mask,
wherein the first and second layers of additional material each include silicon, and the first layer of additional material is a different silicon containing material than the second layer of additional material, and wherein a thickness of the first layer of additional material is different from a thickness of the second layer of additional material prior to utilizing the etch mask and transferring of the pattern.

10. The method of claim 9, wherein the first layer of additional material is deposited by a first plasma deposition process and the second layer of additional material is deposited by a second plasma deposition process.

11. The method of claim 10, wherein the first layer of additional material is deposited through a plasma vapor deposition process, during curing of the EUV photoresist layer.

12. The method of claim 11, wherein the plasma vapor deposition process utilizes dichlorosilane gas.

13. The method of claim 10, wherein the first and second plasma deposition processes have different gas chemistries.

14. The method of claim 13, wherein the first plasma deposition process utilizes dichlorosilane gas and the second plasma deposition process utilizes silicon tetrachloride gas, and wherein the first and second plasma deposition processes are performed without an etching step between the first and second plasma deposition processes.

15. The method of claim 10, wherein an ion flux of the first plasma deposition process is higher in an area above the top surface of the patterned EUV photoresist layer than the other areas of the at least one underlying layer not coated with the patterned EUV photoresist layer such that the first layer of additional material is selectively deposited thicker on the top surface of the patterned EUV photoresist than the other areas of the at least one underlying layer not coated with the patterned EUV photoresist.

16. The method of claim 10, wherein an ion flux of the second plasma deposition process is higher in an area above the top surface of the patterned EUV photoresist layer than the other areas of the at least one underlying layer not coated with the patterned EUV photoresist layer such that the second layer of additional material is selectively deposited thicker on the top surface of the patterned EUV photoresist than the other areas of the at least one underlying layer not coated with the patterned EUV photoresist.

17. The method of claim 9, wherein the depositing the first layer of additional material is performed simultaneously with the cure process.

18. The method of claim 9, wherein the depositing the first layer of additional material is performed after the cure process.

19. The method of claim 9, wherein the first layer of additional material is silicon and the second layer of additional material is silicon chloride.

20. A method for processing a substrate, comprising:
providing the substrate with at least one underlying layer;
providing the substrate with a patterned photoresist layer overlying the at least one underlying layer, the patterned photoresist layer providing patterned areas of the substrate and unpatterned areas of the substrate, the unpatterned areas of the substrate located between side surfaces of the patterned areas;
performing a cure process on the photoresist layer using a dichlorosilane gas;
the method further including depositing an additional material on the substrate, the additional material selectively deposited thicker on a top surface of each patterned area of the photoresist layer than on the unpatterned areas of the substrate, the additional material on the top surface of each patterned area having a first thickness, the additional material on the unpatterned areas having a second thickness that is less than the first thickness, the second thickness being greater than zero; and utilizing the patterned photoresist layer and the additional material as an etch mask and transferring a pattern of the photoresist layer to the at least one underlying layer, wherein the depositing of the additional material includes: (a) depositing a first layer of additional material during the cure process with the dichlorosilane gas so that the additional material is present at a conclusion of the cure process, and (b) depositing a second layer of additional material after the cure process with a silicon tetrachloride gas, and wherein the first layer of additional material and the second layer of additional material are each formed before utilizing the patterned photoresist as an etch mask and transferring the pattern, the first layer of additional material has a different thickness than the second layer of additional material, and the first layer of additional material and the second layer of additional material are formed of silicon containing materials which are different from each other.

21. The method of claim 20, wherein:

the depositing of the first layer of additional material with dichlorosilane gas is performed with a PVD process;

the depositing of the first layer of additional material is followed by the depositing of the second layer of additional material without an etch step in between; and the second layer of additional material is deposited with a thickness larger than a thickness of the first layer of additional material.

22. The method of claim 20, wherein:

the depositing of the first layer of additional material with dichlorosilane gas is performed with a PVD process; and the second layer of additional material is deposited with a thickness larger than a thickness of the first layer of additional material.

* * * * *